(12) United States Patent
Suzuki

(10) Patent No.: US 8,365,121 B2
(45) Date of Patent: Jan. 29, 2013

(54) SUPPORTING METHOD, DESIGN SUPPORTING DEVICE, COMPUTER PRODUCT, AND SEMICONDUCTOR INTEGRATED CIRCUIT

(75) Inventor: Kenji Suzuki, Yokohama (JP)

(73) Assignee: Fujitsu Semiconductor Limited, Yokohama-shi (JP)

( * ) Notice: Subject to any disclaimer, the term of this patent is extended or adjusted under 35 U.S.C. 154(b) by 0 days.

(21) Appl. No.: 13/373,397

(22) Filed: Nov. 14, 2011

(65) Prior Publication Data

US 2012/0060136 A1 Mar. 8, 2012

Related U.S. Application Data

(63) Continuation of application No. PCT/JP2009/060069, filed on Jun. 2, 2009.

(51) Int. Cl.
G06F 17/50 (2006.01)
(52) U.S. Cl. ....................................... 716/114
(58) Field of Classification Search .................... 716/114
See application file for complete search history.

(56) References Cited

U.S. PATENT DOCUMENTS

| | | | | |
|---|---|---|---|---|
| 6,385,759 | B1* | 5/2002 | Batarekh | 716/108 |
| 6,564,359 | B2* | 5/2003 | Saeki | 716/113 |
| 6,774,395 | B1* | 8/2004 | Lin et al. | 257/48 |
| 6,988,254 | B2* | 1/2006 | Iwanishi et al. | 716/114 |

FOREIGN PATENT DOCUMENTS

| | | |
|---|---|---|
| JP | 2000-029562 | 1/2000 |
| JP | 2003-347404 | 12/2003 |
| JP | 2007-110403 | 4/2007 |

OTHER PUBLICATIONS

International Search Report for PCT/JP2009/060069 mailed Jun. 30, 2009.
International Preliminary Report on Patentability dated Dec. 15, 2011 issued in corresponding International Patent Application No. PCT/JP2009/060069.

* cited by examiner

*Primary Examiner* — Jack Chiang
*Assistant Examiner* — Brandon Bowers
(74) *Attorney, Agent, or Firm* — Staas & Halsey LLP

(57) ABSTRACT

A method executed by a computer and for designing a semiconductor integrated circuit, includes detecting, from layout data of a semiconductor integrated circuit, a clock path that propagates the clock signal and of which clock buffers are single-gate inverting clock buffers; selecting sequentially data holding elements connected to the detected clock path; identifying an input clock buffer of each selected data holding element; determining whether the identified clock buffer outputs the clock signal according to non-inverting logic or inverting logic, based on the number of gates from the clock source to the clock buffer; replacing, based on a determination result, the data holding element with a first data holding element that takes in data in synchronization with a rising edge of the clock signal or with a second data holding element that takes in data in synchronization with a falling edge of the clock signal; and outputting a replacement result.

8 Claims, 12 Drawing Sheets

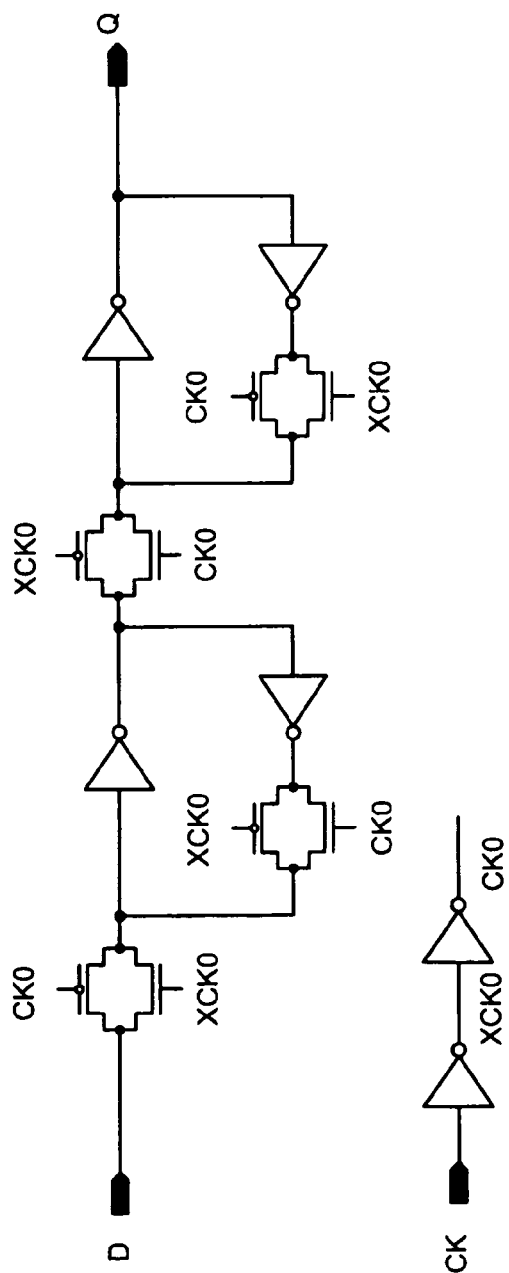

FIG.3
< CLOCK BUFFER WITH ONE GATE >
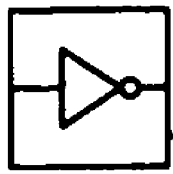
301
< CLOCK BUFFER WITH TWO GATES >
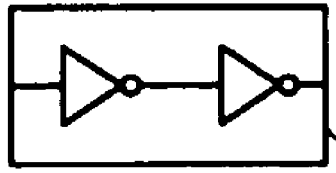
302
< CLOCK BUFFER WITH THREE GATES >
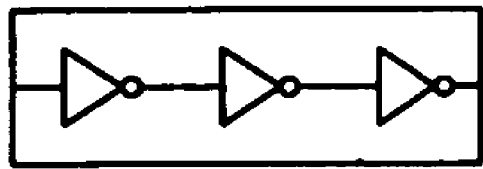
303

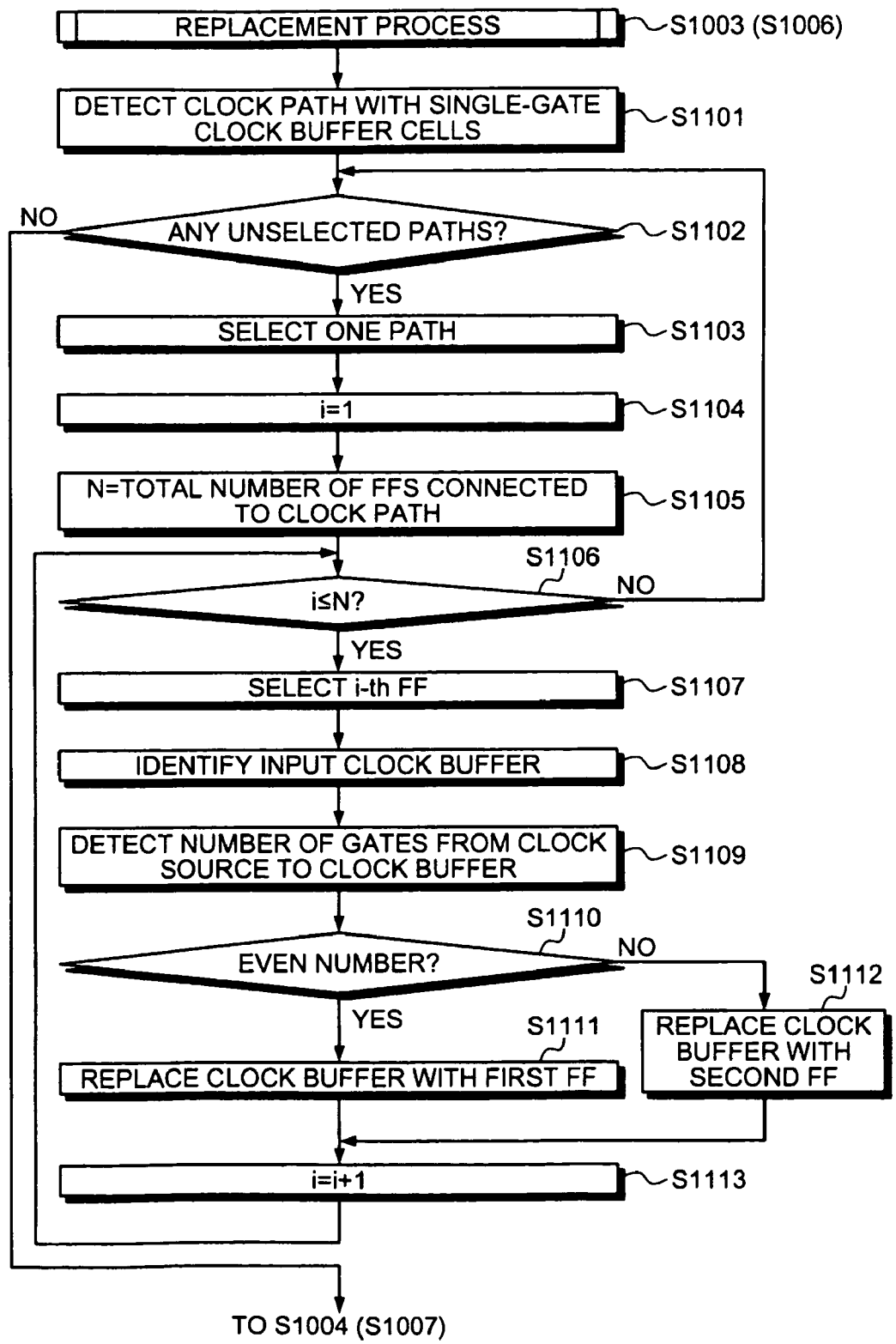

SUPPORTING METHOD, DESIGN SUPPORTING DEVICE, COMPUTER PRODUCT, AND SEMICONDUCTOR INTEGRATED CIRCUIT

CROSS REFERENCE TO THE RELATED APPLICATIONS

This application is a continuation application of International Application PCT/JP2009/060069, filed Jun. 2, 2009, and designating the U.S., the entire contents of which are incorporated herein by reference.

FIELD

The embodiments discussed herein are related to a design supporting method, a design supporting device, a computer product, and a semiconductor integrated circuit that support layout design and generation of layout data.

BACKGROUND

Clock gating/power gating that stop supplying to a circuit(s), a clock signal/source voltage that is not necessary for operation are conventionally known as techniques to reduce power consumption of a semiconductor integrated circuit (hereinafter, "first conventional technology"). Voltage reduction and the provision of multiple power sources are also known as techniques to reduce power consumption (hereinafter, "second conventional technology").

The use of a data holding element (hereinafter, "first flip flop (FF)") that takes in data in synchronization with the rising edge of a clock signal and/or a data holding element (hereinafter, "second FF") that takes in data in synchronization with the falling edge of a clock signal (hereinafter, "third conventional technology") is known as a technique for reducing clock skew and noise (see, for example, Japanese Laid-Open Patent Publication Nos. 2000-29562, 2003-347404, and 2007-110403).

However, the first conventional technology cannot be applied to a circuit in which a clock path needs to be operated continuously. The second conventional technology cannot reduce the source voltage when a clock path is always operated fast, since the reduction of the source voltage causes slow operation of the semiconductor integrated circuit.

The third conventional technology propagates a clock signal input into the first FF and the second FF by clock buffers each of which includes multiple gates. Thus, a non-inverting clock buffer that includes an even number (2 or more) of gates is always inserted when non-inverting logic is required, thereby increasing the number of gates on the clock path.

SUMMARY

According to an aspect of an embodiment, a design supporting method of designing a semiconductor integrated circuit that includes a plurality of data holding elements and a clock path that propagates a clock signal from a clock source to the data holding elements is executed by a computer and includes detecting, from layout data of the semiconductor integrated circuit, a clock path that propagates the clock signal and of which clock buffers are single-gate inverting clock buffers; selecting sequentially the data holding elements connected to the clock path detected at the detecting; identifying an input clock buffer of the data holding element, each time a data holding element is selected at the selecting; determining whether the clock buffer identified at the identifying outputs the clock signal from the clock source according to non-inverting logic or inverting logic, based on a number of gates from the clock source to the clock buffer; replacing, based on a result obtained at the determining, the data holding element with a first data holding element that takes in data in synchronization with a rising edge of the clock signal or with a second data holding element that takes in data in synchronization with a falling edge of the clock signal; and outputting a result obtained at the replacing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2A is a diagram of an example of a first FF.
FIG. 3 is a diagram of examples of clock buffers.
FIG. 11 is a flowchart of details of a replacement process depicted in FIG. 10 (step S1003/S1006).

DESCRIPTION OF EMBODIMENTS

Preferred embodiments of the present invention will be explained with reference to the accompanying drawings.

In the embodiments, an input clock buffer of a data holding element connected to a clock path that propagates a clock signal from a clock source is configured by an inverting clock buffer that includes one gate (hereinafter, "single-gate inverting clock buffer"). In the present embodiments, an FF is used as the data holding element. The FF is the first FF described above if the number of gates from the clock source to the input clock buffer of the FF is an even number, and is the second FF if the number of gates is an odd number.

In a first embodiment, a semiconductor integrated circuit that includes a clock path for which the number of gates is optimized by single-gate clock buffers is described. In a second embodiment, a design supporting device that replaces an FF connected to the clock path described above with the first FF or the second FF is described. An overview of the first embodiment is depicted in FIG. 1.

Figure 1:
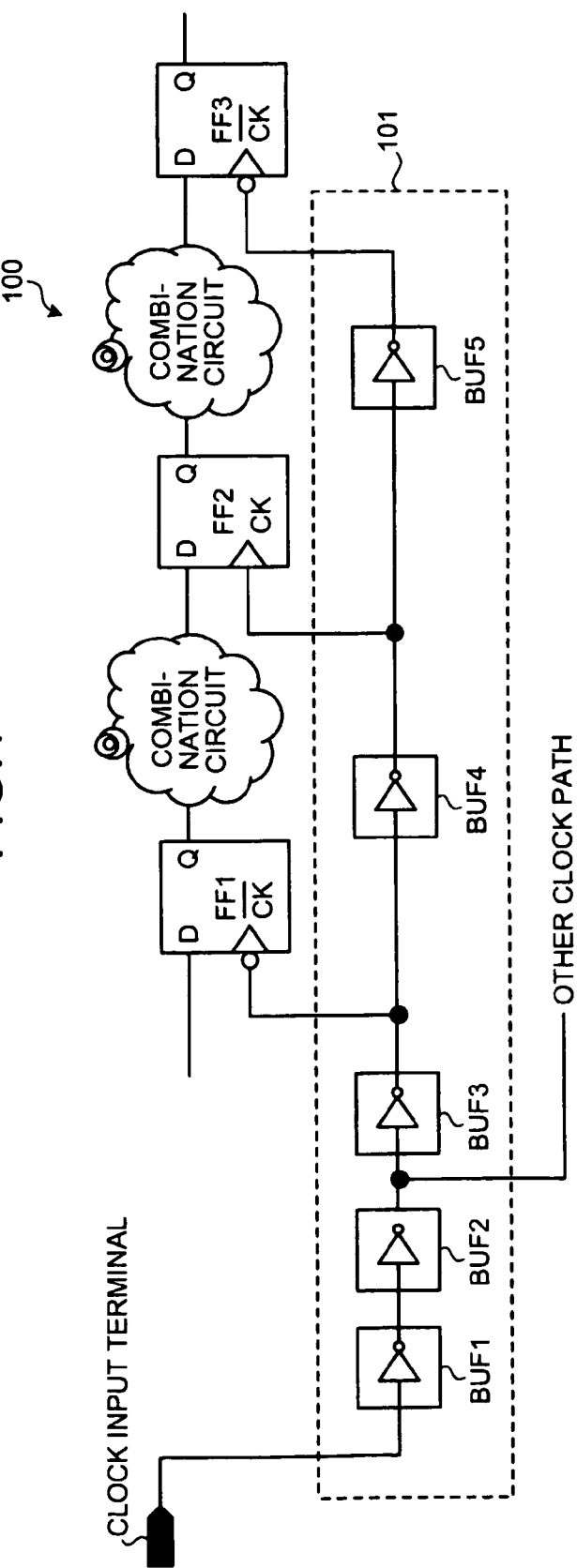
FIG. 1 is a diagram of an example of a semiconductor integrated circuit according to a first embodiment.

FIG. 1 is a diagram of an example of a semiconductor integrated circuit according to the first embodiment. A semiconductor integrated circuit 100 includes a clock path 101 that propagates a clock signal input from a clock input terminal, FF1 to FF3 connected to the clock path 101, and BUF1 to BUF5 on the clock path 101 each of which includes one gate. In the first embodiment, the clock input terminal is described as the clock source; alternatively, the clock source may be a clock generating circuit that generates a clock signal.

BUF1 to BUF5 are single-gate inverting clock buffers. In the semiconductor integrated circuit 100, FF1 to FF3 take in data in synchronization with the rising edge or the falling edge of the clock signal according to whether the input clock buffers of FF1 to FF3 output the clock signal from the clock input terminal according to non-inverting logic.

Taking FF1 as an example, FF1 is the second FF since the number of gates from the clock input terminal to the input clock BUF3 of FF1 is 3. Taking FF2 as an example, FF2 is the first FF since the number of gates from the clock input terminal to the input clock BUF4 of FF2 is 4.

Taking FF3 as an example, FF3 is the second FF since the number of gates from the clock input terminal to the input clock BUF5 of FF3 is 5. Thus, the clock path is formed by single-gate clock buffers, thereby minimizing the number of gates and reducing power consumption of the semiconductor integrated circuit.

In the second embodiment, an FF connected to a clock path of which clock buffers are single-gate clock buffers is replaced with the first FF or the second FF according to whether the input clock buffer of the FF outputs the clock signal from the clock source according to non-inverting logic, thereby reducing the number of gates on the clock path as much as possible and reducing power consumption. An example of the first FF and the second FF is described in FIGS. 2A and 2B.

FIG. 2A is a diagram of an example of the first FF. <LAYOUT> represents layout data of a first FF 201 that is an example of an FF that takes in data in synchronization with the rising edge of the clock signal. The first FF 201 is actually layout data, but is represented by a circuit diagram for easy understanding.

The first FF 201, in synchronization with the rising edge of the clock signal input into CK, takes in data input into D, and outputs the data from Q. <SYMBOL> represents a symbol of the first FF 201 by which the first FF 201 is represented in the layout data of the semiconductor integrated circuit described later. The first FF 201 is described in a library and stored in storage or accessible storage of an external computer. The second FF is described in FIG. 2B.

Figure 2B:
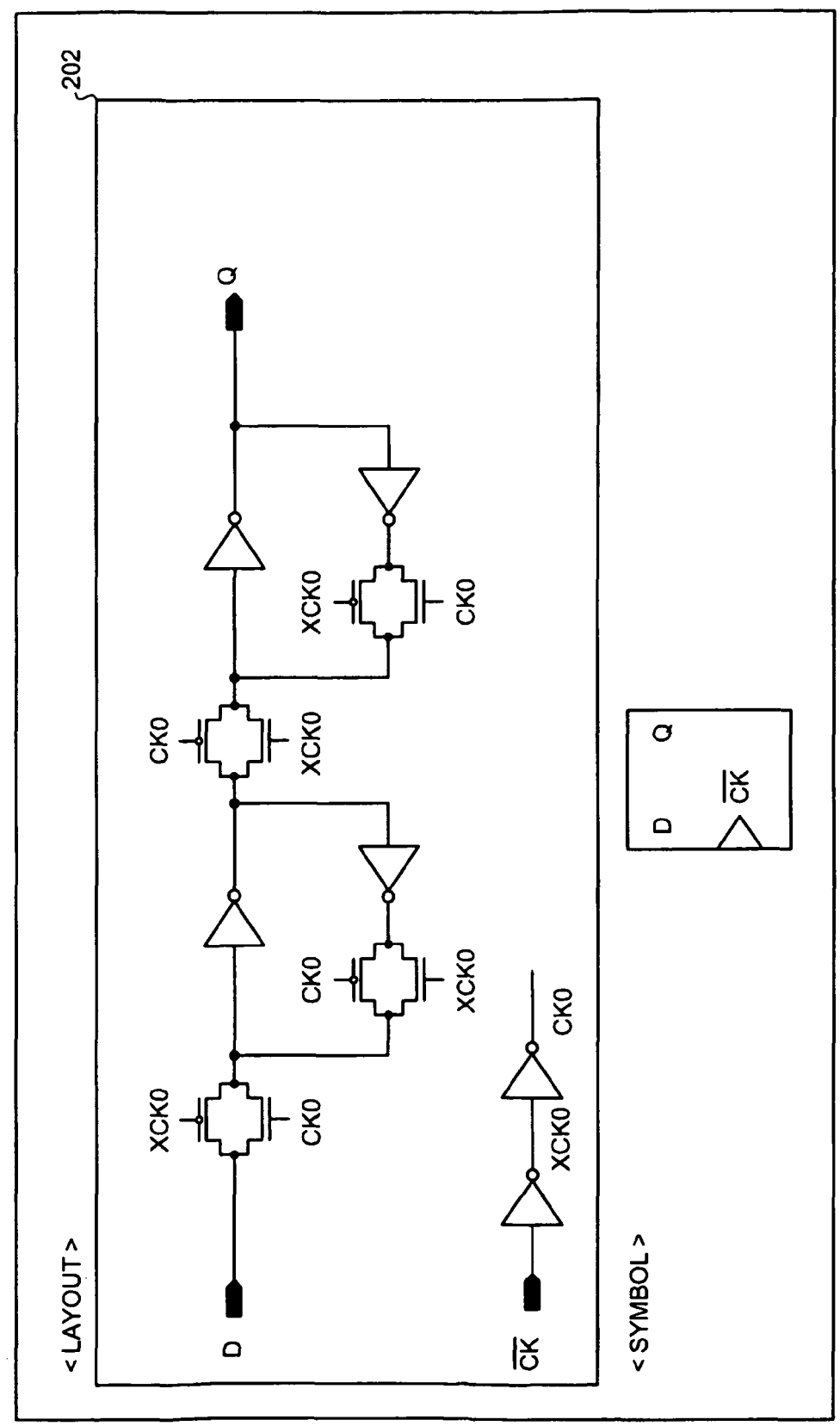
FIG. 2B is a diagram of an example of a second FF.

FIG. 2B is a diagram of an example of the second FF. <LAYOUT> represents layout data of a second FF 202 that is an example of an FF that takes in data in synchronization with the falling edge of the clock signal. The second FF 202 is actually layout data, but is represented by a circuit diagram for easy understanding.

The second FF 202, in synchronization with the falling edge of the clock signal input into /CK, takes in data input into D, and outputs the data from Q. <SYMBOL> represents a symbol of the second FF 202, by which the second FF 202 is represented in the layout data of the semiconductor integrated circuit described later. The second FF 202 is described in a library and stored in storage or accessible storage of an external computer. Examples of clock buffer are depicted in FIG. 3.

FIG. 3 is a diagram of examples of clock buffers. A clock buffer 301 is configured by one gate and is of inverting logic. A clock buffer 302 is configured by two gates and is of non-inverting logic. A clock buffer 303 is configured by three gates and is of inverting logic.

The clock buffer 303 is conventionally used when inverting logic is required. In contrast, the clock buffer 301 is used in the present embodiment, whereby a clock tree is constructed or skew is adjusted.

Figure 4:
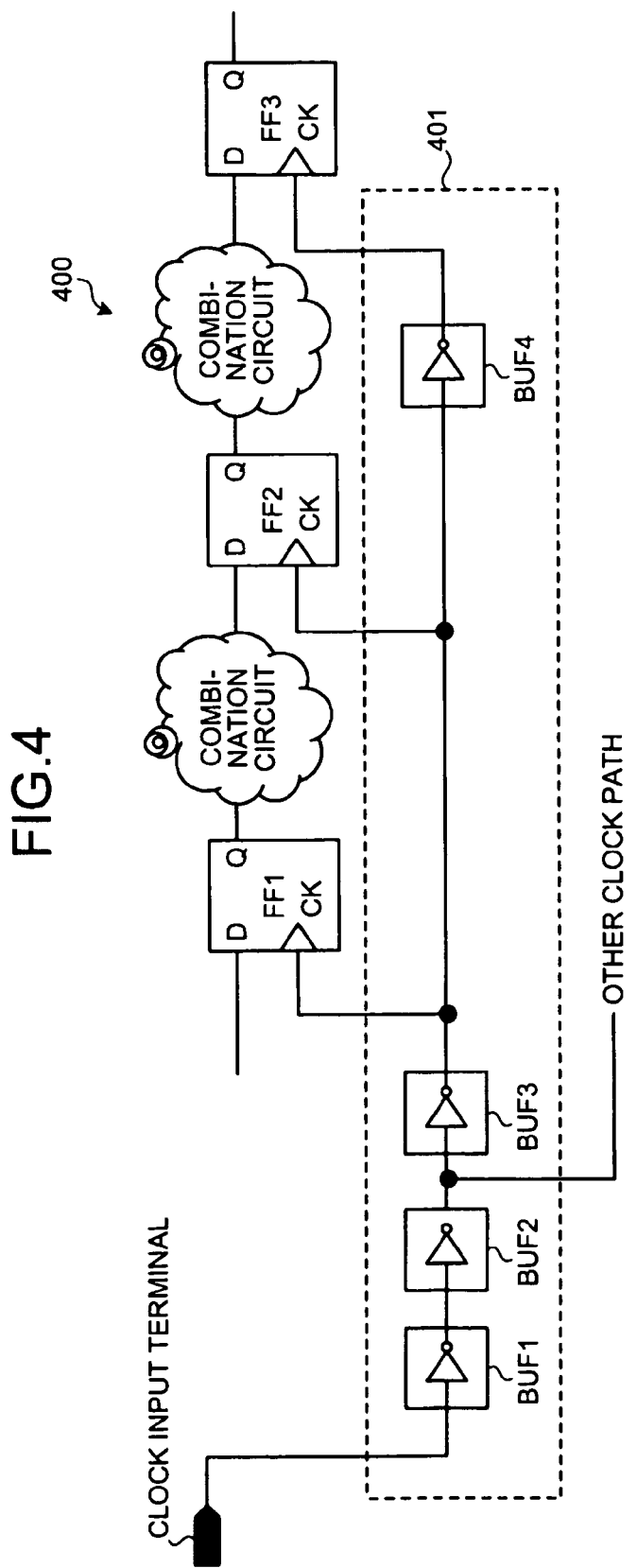
FIG. 4 is a diagram of layout data of a layout under design.

FIG. 4 is a diagram of layout data of a layout under design. Layout data 400 includes a clock path 401 that propagates the clock signal input into the clock input terminal, FF1 to FF3 connected to the clock path 401, a combination circuit, and BUF1 to BUF4 that are the clock buffers 301.

The layout data 400 are represented by a circuit diagram for easy understanding, but are actually physical data. For example, FF1 to FF3 and BUF1 to BUF4 are instance names for identifying the FFs. The physical data include information such as coordinates indicating position, connections among cells, data concerning layers forming each cell, and wiring width. For example, replacing FF1 with the first FF 201 means to actually rewrite the cell name of FF1 in the physical data.

FF1 to FF3 are the first FFs 201 in the layout data 400. In actuality, FF1 to FF3 may be either the first FF 201 or the second FF 202. Alternatively, for example, FF1 to FF3 may be dummy FFs having the same shape and the same area as the first FF 201 and the second FF 202.

All of BUF1 to BUF4 are the clock buffers 301 described above. The clock input terminal is described as the clock source in the layout data 400; alternatively, the clock source may be a clock generating circuit that generates a clock signal.

FF1 to FF3 are replaced with the first FF 201 or the second FF 202 by the design supporting device according to the second embodiment. The layout data 400 are stored in storage or accessible storage of an external computer.

Figure 5:
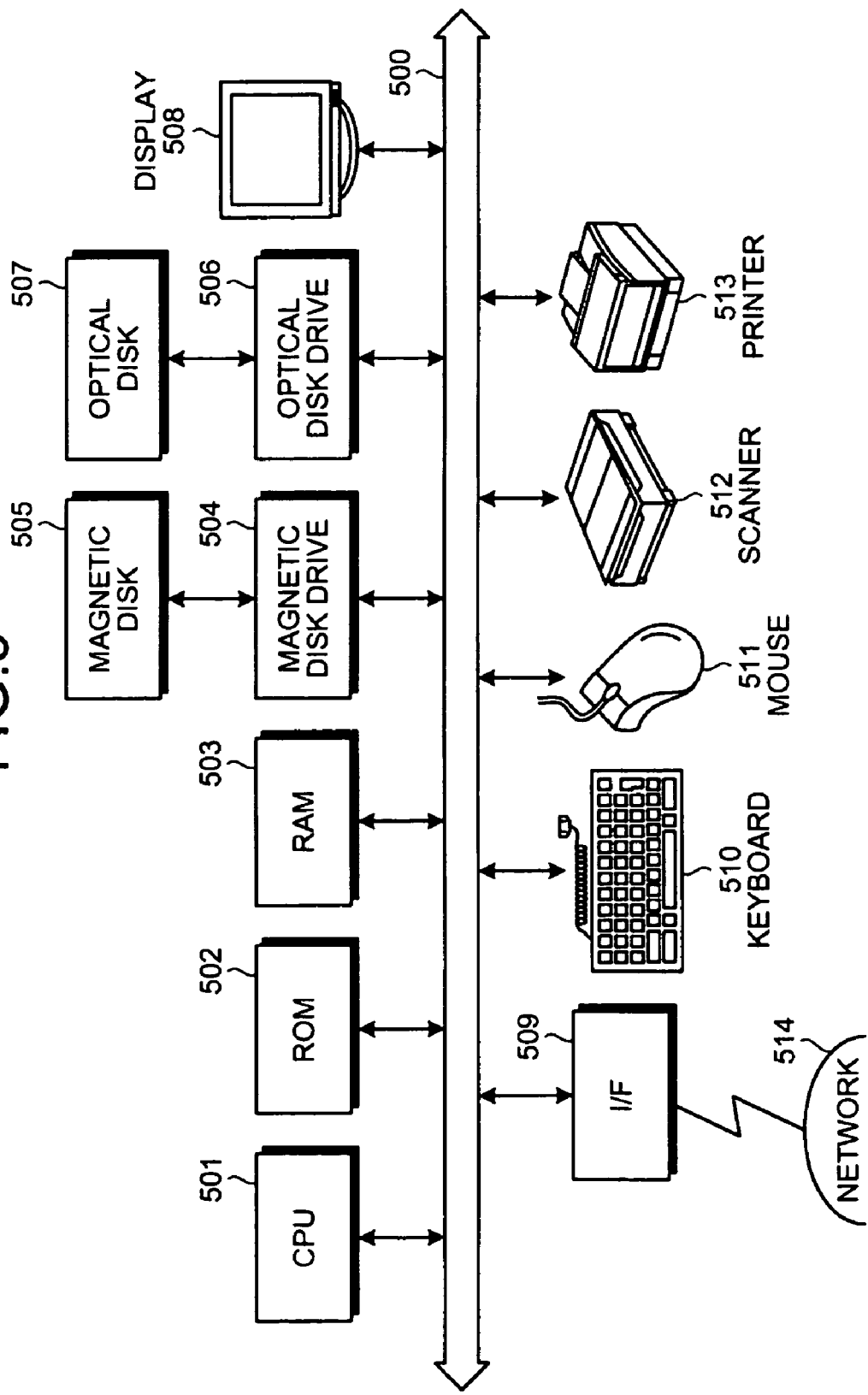
FIG. 5 is a block diagram of an example of a hardware configuration of the design supporting device according to a second embodiment.

FIG. 5 is a block diagram of an example of a hardware configuration of the design supporting device according to the second embodiment. As depicted in FIG. 5, the design supporting device includes a central processing unit (CPU) 501, a read-only memory (ROM) 502, a random access memory (RAM) 503, a magnetic disk drive 504, a magnetic disk 505, an optical disk drive 506, an optical disk 507, a display 508, an interface (I/F) 509, a keyboard 510, a mouse 511, a scanner 512, and a printer 513, respectively connected by a bus 500.

The CPU 501 governs overall control of the design supporting device. The ROM 502 stores therein programs such as a boot program. The RAM 503 is used as a work area of the CPU 501. The magnetic disk drive 504, under the control of the CPU 501, controls the reading and writing of data with respect to the magnetic disk 505. The magnetic disk 505 stores therein data written under control of the magnetic disk drive 504.

The optical disk drive 506, under the control of the CPU 501, controls the reading and writing of data with respect to the optical disk 507. The optical disk 507 stores therein data written under control of the optical disk drive 506, the data being read by a computer.

The display 508 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 508.

The I/F 509 is connected to a network 514 such as the local area network (LAN), the wide area network (WAN), and the Internet via a communication line, and to other apparatuses through the network 514. The I/F 509 administers an internal interface with the network 514 and controls the input/output of data from/to external apparatuses. For example, a modem or a LAN adaptor may be employed as the I/F 509.

The keyboard 510 includes, for example, keys for inputting letters, numerals, and various instructions and performs the input of data. Alternatively, a touch-panel-type input pad or numeric keypad, etc. may be adopted. The mouse 511 is used to move the cursor, select a region, or move and change the size of windows. A track ball or a joy stick may be adopted provided each respectively has a function similar to a pointing device.

The scanner 512 optically reads an image and takes in the image data into the design supporting device. The scanner 512 may have an optical character reader (OCR) function as well. The printer 513 prints image data and text data. The printer 513 may be, for example, a laser printer or an ink jet printer.

Figure 6:
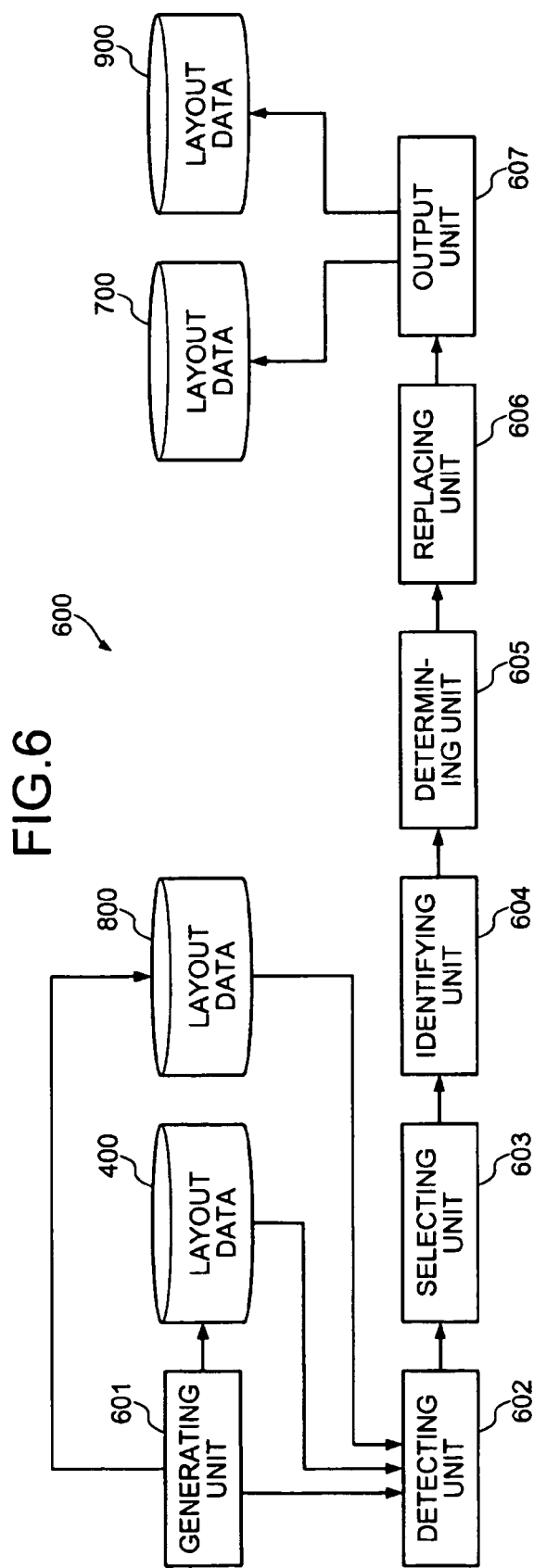
FIG. 6 is a block diagram of an example of a functional configuration of the design supporting device according to the second embodiment.

FIG. 6 is a block diagram of an example of a functional configuration of the design supporting device according to the second embodiment. A design supporting device 600 includes a generating unit 601, a detecting unit 602, a selecting unit 603, an identifying unit 604, a determining unit 605, a replacing unit 606, and an output unit 607. Functions of control units of the design supporting device 600 (the generating unit 601 to the output unit 607) are implemented by, for example, the I/F 509 or the CPU 501 executing a program stored in storage such as the ROM 502, the RAM 503, the magnetic disk 505, and the optical disk 507 depicted in FIG. 5.

The generating unit 601 generates layout data by constructing a clock tree, using cells of single-gate inverting clock buffers for at least a specified clock path.

For example, the CPU 501 generates layout data after a clock tree is constructed by specifying a clock tree to be constructed such that a specified clock path includes only clock buffers 301, and using an existing tool for construction of clock tree. The result of the generation is stored to storage such as the RAM 503, the magnetic disk 505, and the optical disk 507.

The result of the generation is, for example, the layout data 400 described above. The number of gates on a clock path is optimized by constructing the clock tree using single-gate clock buffers, thereby reducing the number of gates on the clock path as much as possible and reducing power consumption.

The detecting unit 602 detects a clock path that propagates the clock signal from the clock source and of which clock buffers are single-gate inverting clock buffers, from the layout data generated by the generating unit 601. For example, the CPU 501 accesses the storage and detects a clock path that uses only clock buffers 301, from the layout data 400. Alternatively, a clock path specified in advance by a user may be detected.

In the layout data 400, the clock path 401 is detected as a clock path of which clock buffers are single-gate inverting clock buffers. The result of the detection is stored to the storage such as the RAM 503, the magnetic disk 505, and the optical disk 507.

The selecting unit 603 sequentially selects FFs connected to the clock path detected by the detecting unit 602. For example, the CPU 501 sequentially selects FFs connected to the clock path 401, from the layout data 400. For example, FF1 is selected first, FF2 is selected next, and finally FF3 is selected.

The identifying unit 604 identifies an input clock buffer of the FF selected by the selecting unit 603. Taking FF1 connected to the clock path 401 as an example, the CPU 501 detects a net connected to CK of FF1, from the layout data 400 and identifies, as the input clock buffer of FF1, a clock buffer to which the detected net is connected as an output destination. Thus, BUF3 is identified as the input clock buffer of FF1.

Based on the number of gates from the clock source to the clock buffer, the determining unit 605 determines whether the clock buffer identified by the identifying unit 604 outputs the clock signal from the clock source according to non-inverting logic.

For example, the CPU 501 accesses the storage and reads the layout data 400, and detects the number of gates from the clock input terminal to the identified clock buffer. The CPU 501 determines that the identified clock buffer outputs the clock signal according to non-inverting logic if the detected number of gates is an even number, and determines that the identified clock buffer outputs the clock signal according to inverting logic if the detected number of gates is an odd number.

Taking the input clock buffer BUF3 of FF1 in the layout data 400 as an example, BUF3 is determined to output the clock signal from the clock input terminal according to inverting logic since the number of gates from the clock input terminal to BUF3 is 3. The result of the determination is stored to the storage such as the RAM 503, the magnetic disk 505, and the optical disk 507.

The replacing unit 606 replaces the selected FF with the first FF if the determining unit 605 determines that the identified clock buffer outputs the clock signal according to non-inverting logic, and replaces the selected FF with the second FF if the determining unit 605 determines that the identified clock buffer outputs the clock signal according to inverting logic.

For example, the CPU 501 accesses the storage and reads the layout data 400 and the result of the determination, and replaces the selected FF in the layout data 400 with the first FF 201 if the result of the determination indicates an even number, and replaces the selected FF with the second FF 202 if the result of the determination indicates an odd number.

Taking FF1 in the layout data 400 as an example, FF1 is replaced with the second FF 202 since the input clock BUF3 of FF1 is determined to output the clock signal from the clock input terminal according to inverting logic, as described above.

The output unit 607 outputs the result of the replacement by the replacing unit 606. For example, the CPU 501 outputs the layout data. The form of output includes, for example, display on the display 508, printout at the printer 513, and/or transmission to an external device via the I/F 509. Alternatively, the layout data may be stored to storage such as the RAM 503, the magnetic disk 505, and the optical disk 507. The output layout data are depicted in FIG. 7.

Figure 7:
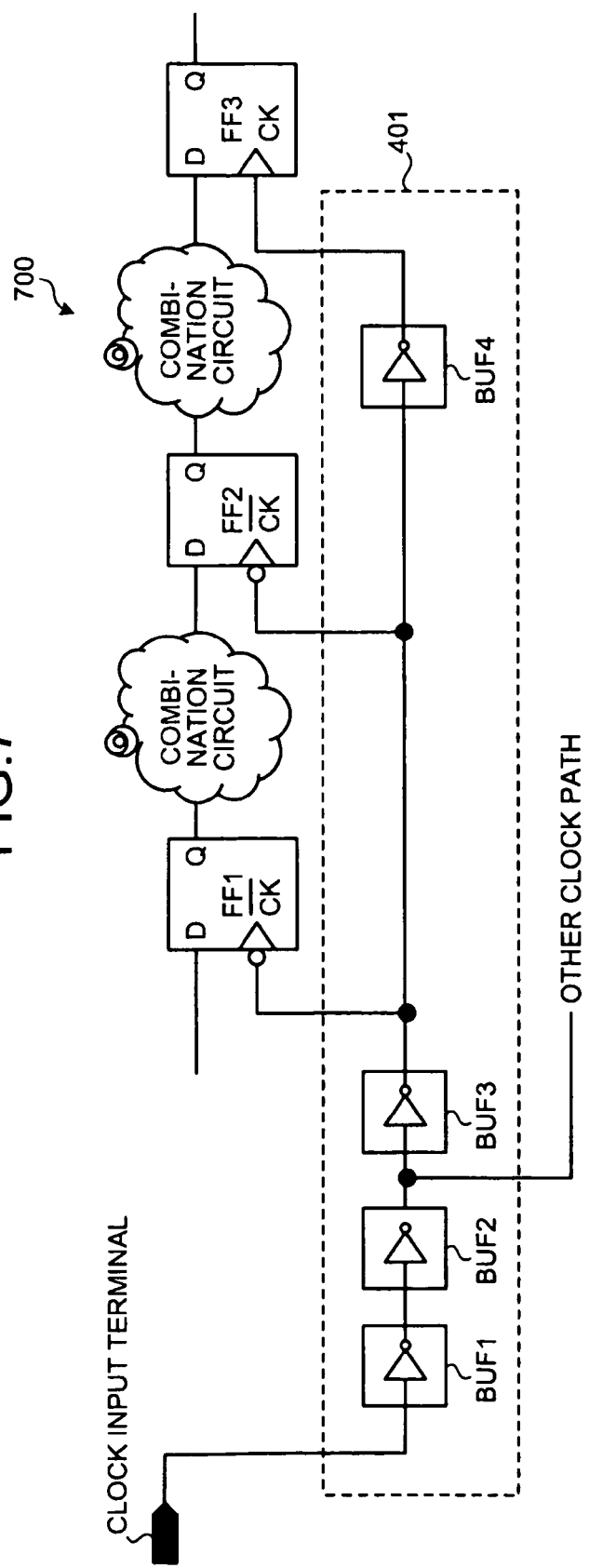
FIG. 7 is a diagram of an example in which the FFs in the layout data 400 are replaced and output.

FIG. 7 is a diagram of an example in which the FFs in the layout data 400 are replaced and output. Layout data 700 include the clock path 401 that propagates the clock signal from the clock input terminal, FF1 and FF2 that are the second FFs 202 connected to the clock path 401, FF3 that is the first FF 201 connected to the clock path 401, and BUF1 to BUF4 that are clock buffers.

Thus, FFs connected to a clock path for which the number of gates is optimized are automatically replaced with appropriate FFs according to the waveform of the clock signal, thereby facilitating layout design and the generation of layout data that includes a clock path with a minimum number of gates, and reducing power consumption.

Further, the generating unit 601 generates the layout data by adjusting skew of at least a specified clock path, using only single-gate inverting clock buffers. For example, the CPU 501 generates layout data in which skew has been adjusted by specifying adjustment of the skew using only clock buffers 301, and using an existing tool for adjustment of skew. The result of the generation is stored in the storage such as the RAM 503, the magnetic disk 505, and the optical disk 507. The result of the generation is depicted in FIG. 8.

Figure 8:
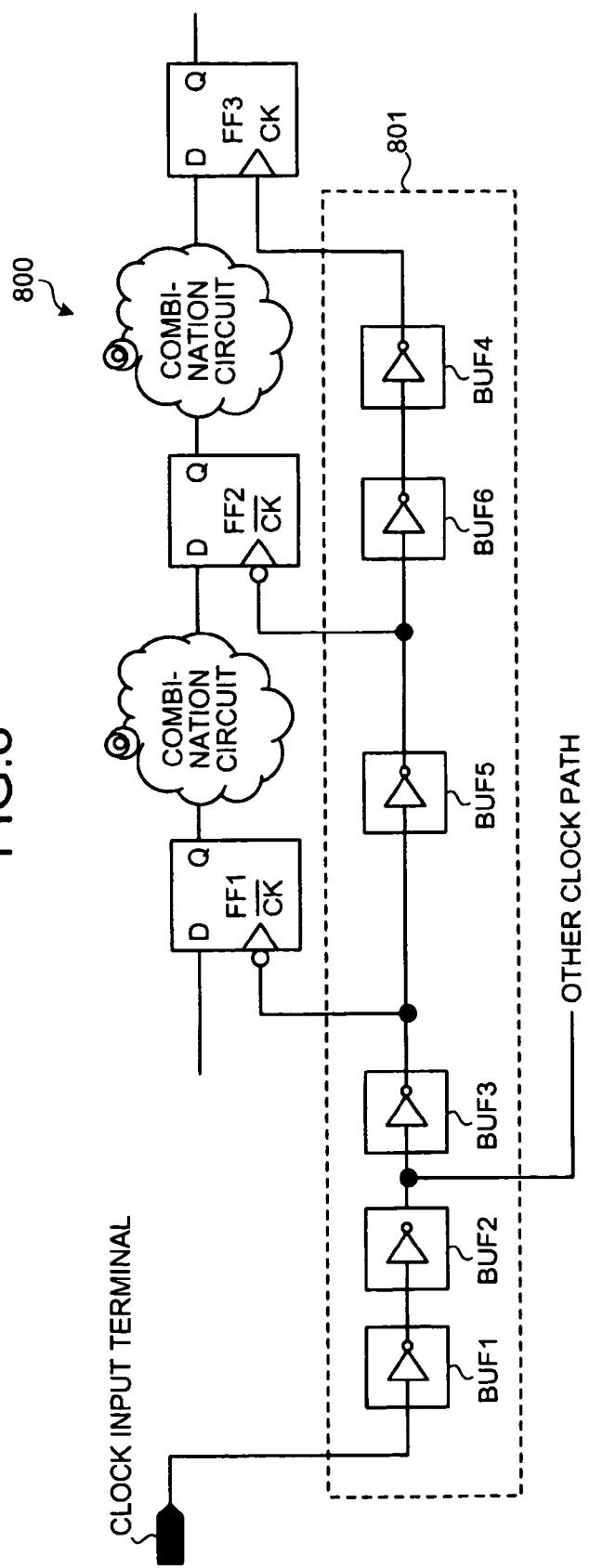
FIG. 8 is a diagram of the layout data in which skew has been adjusted.

FIG. 8 is a diagram of the layout data in which skew has been adjusted. Layout data 800 include BUF5 and BUF6 as well as the same components as those of the layout data 700. The number of gates on a clock path is optimized by adjusting the skew using single-gate clock buffers, thereby reducing the number of gates on the clock path as much as possible and reducing power consumption.

Referring back to FIG. 6, the detecting unit 602 detects a clock path that propagates the clock signal from the clock source and of which clock buffers are single-gate inverting clock buffers, from the layout data 800 generated by the generating unit 601 in which skew has been adjusted. For example, the CPU 501 accesses the storage and detects a clock path that uses only clock buffers 301, from the layout data 800. Alternatively, a clock path specified in advance by a user may be detected.

In the layout data 800, a clock path 801 is detected as a clock path of which clock buffers are single-gate inverting clock buffers. The result of the detection is stored to the storage such as the RAM 503, the magnetic disk 505, and the optical disk 507.

Next, FFs connected to the clock path 801 in the layout data 800 are again replaced with the first FF 201 or the second FF 202 by the functions of the selecting unit 603 to the output unit 607 described above. The result of the replacement is depicted in FIG. 9.

Figure 9:
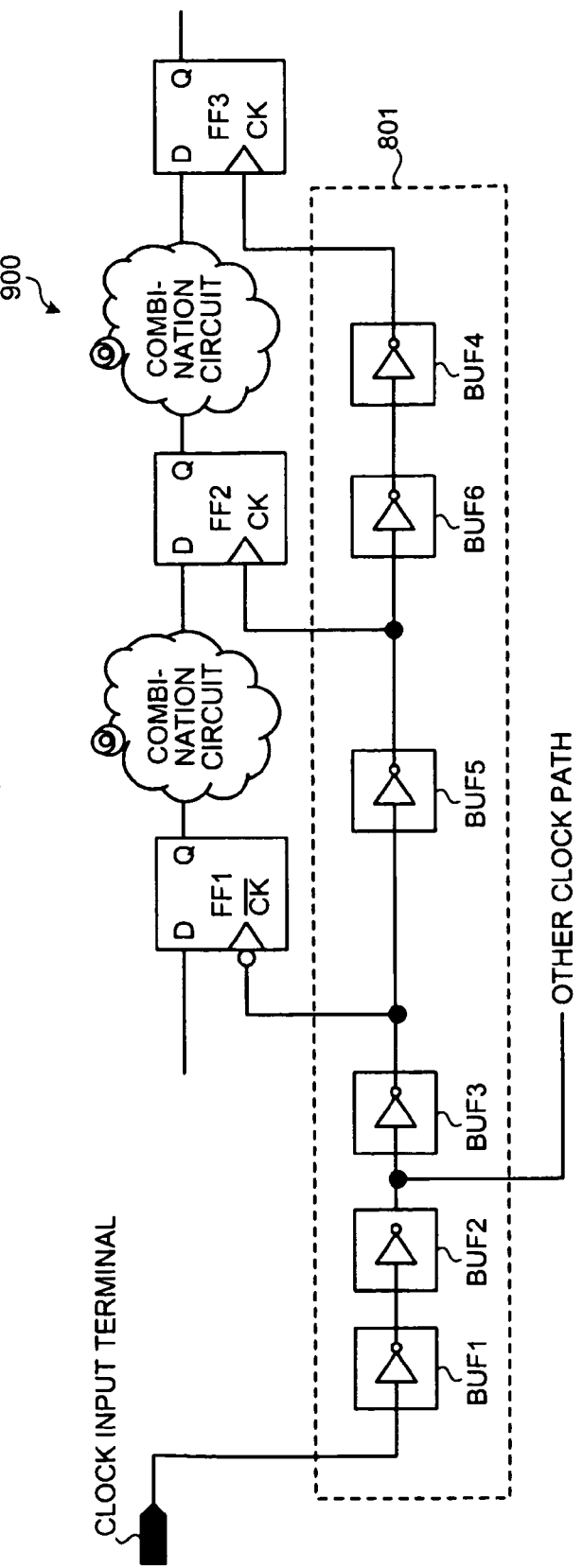
FIG. 9 is a diagram of an example in which the FFs in the layout data 800 are replaced and output.

FIG. 9 is a diagram of an example in which the FFs in the layout data 800 are replaced and output. FF2 is replaced with the first FF 201 in layout data 900 since the number of gates from the clock input terminal to the input clock BUF5 of FF2 is 4. Other components are the same as those of the layout data 800. Thus, FFs can be easily replaced even in layout data in which skew has been adjusted, thereby minimizing the number of gates on a clock path and reducing power consumption.

In the second embodiment, each FF is determined to be the first FF 201 or the second FF 202, based on the number of gates from the clock source to the input clock buffer of the FF. The FF may be determined to be the first FF 201 or the second FF 202, based on the number of gates from a point specified by a user, to the input clock buffer of the FF. In this case, the point specified by the user is assumed to be a clock starting point to determine whether the identified clock buffer outputs the clock signal from the clock source according to non-inverting logic or according to inverting logic. It is assumed that whether the clock signal from the clock source is output according to non-inverting logic or inverting logic at the clock starting point, is determined in advance.

A function of the determining unit 605 when a point where the clock signal from the clock source is propagated according to non-inverting logic is specified by the user as the clock starting point, is described. The determining unit 605 determines that the clock signal from the clock source is output according to non-inverting logic if the number of gates from the clock starting point to the identified clock buffer is an even number, and determines that the clock signal is output according to inverting logic if the number of gates is an odd number. The detection of the number of gates is the same as the process performed by the determining unit 605 described above, and detailed description is omitted.

A function of the determining unit 605 when a point where the clock signal from the clock source is propagated according to inverting logic is specified by the user as the clock starting point, is described. The determining unit 605 determines that the clock signal from the clock source is output according to non-inverting logic if the number of gates from the clock starting point to the identified clock buffer is an odd number, and determines that the clock signal is output according to inverting logic if the number of gates is an even number. The detection of the number of gates is the same as the process performed by the determining unit 605 described above, and detailed description is omitted.

Figure 10:
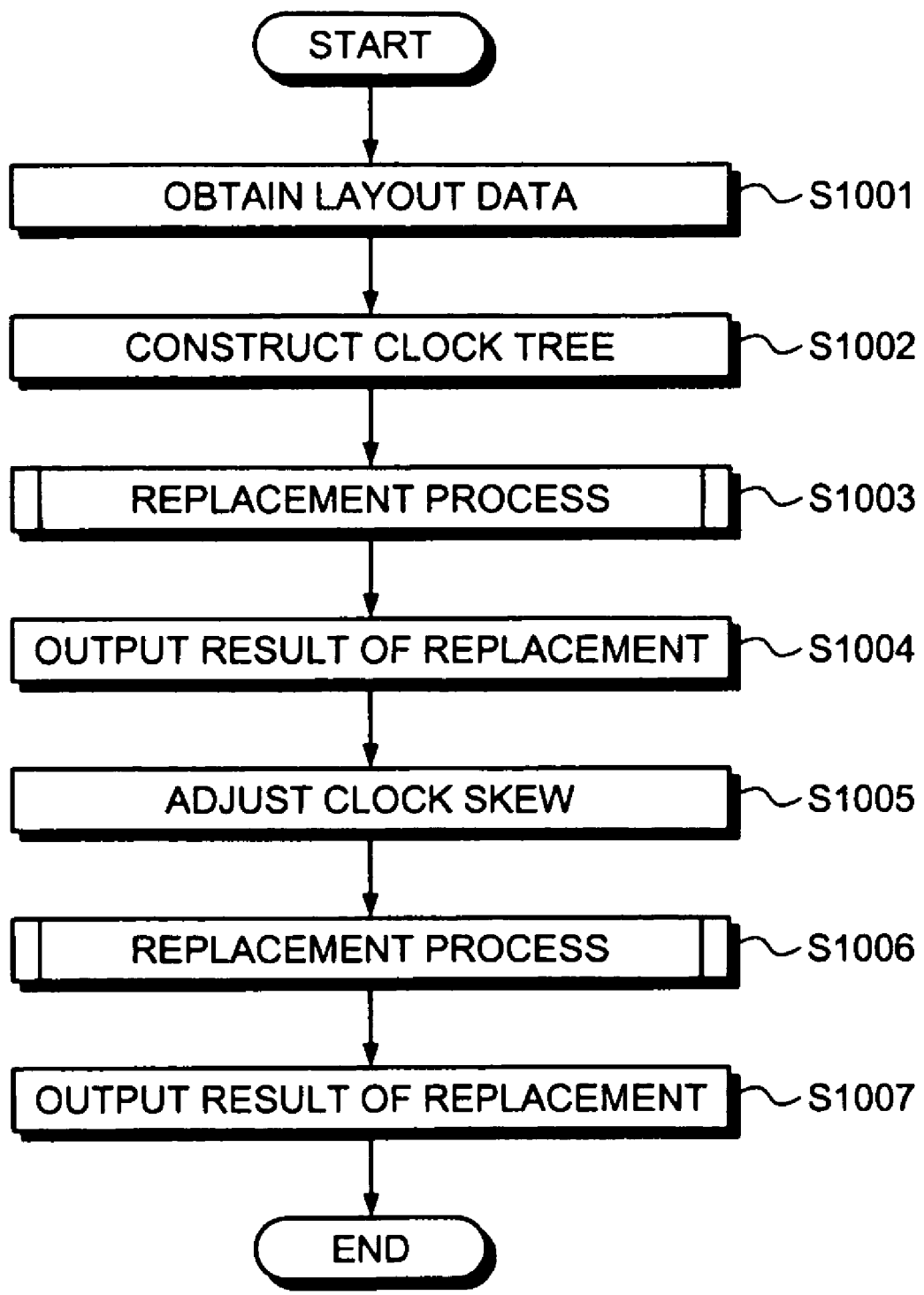
FIG. 10 is a flowchart of a design supporting process performed by the design supporting device according to the second embodiment.

FIG. 10 is a flowchart of a design supporting process performed by the design supporting device 600 according to the second embodiment. Layout data after initial arrangement are obtained (step S1001). The generating unit 601 constructs a clock tree in the obtained layout data (step S1002). The layout data 400 described above are an example of the layout data in which the clock tree is constructed.

The detecting unit 602 to the replacing unit 606 perform a replacement process (step S1003), and the output unit 607 outputs the result of the replacement (step S1004). For example, the layout data 700 described above are the result of the replacement. The generating unit 601 adjusts clock skew (step S1005). The layout data 800 described above are an example of the layout data 700 in which clock skew has been adjusted. The detecting unit 602 to the replacing unit 606 perform the replacement process (step S1006), and the output unit 607 outputs the result of the replacement (step S1007), thereby ending the sequence of processes. The layout data 900 described above are the result of the replacement. The replacement process (step S1003/S1006) is described in FIG. 11.

FIG. 11 is a flowchart of details of the replacement process depicted in FIG. 10 (step S1003/S1006). The detecting unit 602 detects a clock path of which clock buffer cells are single-gate inverting clock buffer cells (step S1101), and determines whether there is any clock path that has not yet been selected (step S1102).

If there is a clock path that has not yet been selected (step S1102: YES), one of the clock paths is selected (step S1103), and i is set to 1 (step S1104). N is set to the total number of FFs connected to the clock path (step S1105), and it is determined whether i is at most N (step S1106).

If it is determined that i is less than or equal to N (step S1106: YES), the selecting unit 603 selects an i-th FF (step S1107), and the identifying unit 604 identifies the input clock buffer (step S1108). The number of gates from the clock source to the clock buffer is detected (step S1109), and the determining unit 605 determines whether the number of gates from the clock source to the clock buffer is an even number (step S1110). It is determined whether the identified clock buffer outputs the clock signal according to non-inverting logic or inverting logic, based on the number of gates from the clock source to the clock buffer.

If the number of gates is determined to be an even number (step S1110: YES), the replacing unit 606 replaces the i-th FF with the first FF (step S1111), i is incremented (step S1113), and the process returns to step S1106. On the other hand, if the number of gates is determined not to be an even number (determined to be an odd number) (step S1110: NO), the replacing unit 606 replaces the i-th FF with the second FF (step S1112), and the process proceeds to step S1113 described above.

If it is determined that i is greater than N (step S1106: NO), the process proceeds to step S1102. If it is determined that there is no clock path that has not yet been selected (step S1102: NO), the process proceeds to step S1004 (or step S1007).

As described above, according to the embodiments, FFs connected to a clock path formed by single-gate clock buffers

301 are replaced with the first FF 201 or the second FF 202, based on the number of gates from the clock source to the input clock buffers.

Thus, FFs connected to a clock path for which the number of gates is optimized are automatically replaced with appropriate FFs according to the waveform of the clock signal, thereby facilitating layout design and the generation of layout data that includes a clock path with a minimum number of gates, and reducing power consumption.

The FF is replaced with the first FF if the number of gates from the clock source to the input clock buffer of the FF is an even number, and is replaced with the second FF if the number of gates is an odd number. Thus, FFs can be easily replaced according to the number of gates, enabling reductions in power consumption.

Layout data in which a clock tree is constructed using only single-gate inverting clock buffers are automatically generated, whereby the clock tree is constructed with a minimum number of gates, enabling reductions in power consumption.

Further, layout data in which skew is adjusted using only single-gate inverting clock buffers are automatically generated, whereby the skew is adjusted with a minimum number of gates, enabling reductions in power consumption.

The FF is replaced with the first FF if the number of gates from a clock starting point (which is specified by a user to output the clock signal from the clock source according to non-inverting logic) to the input clock buffer of the FF is an even number, and replaced with the second FF if the number of gates is an odd number. Thus, according to the number of gates, it can be easily determined whether the clock signal from the clock source is output according to non-inverting logic. Thus, FFs can be easily replaced according to the number of gates, enabling reductions in power consumption. Since only the number of gates from a specified point is searched for, the time required for the search can be also shortened.

Further, the FF is replaced with the first FF if the number of gates from a clock starting point (which is specified by a user to output the clock signal according to inverting logic) to the input clock buffer of the FF is an odd number, and replaced with the second FF if the number of gates is an even number. Thus, according to the number of gates, it can be easily determined whether the clock signal from the clock source is output according to non-inverting logic. Thus, FFs can be easily replaced according to the number of gates, enabling reductions in power consumption. Since only the number of gates from a specified point is searched for, the time required for the search can be also shortened.

As described, the semiconductor integrated circuit includes a clock path, FFs connected to the clock path, and single-gate input clock buffers of FFs, thereby forming the clock path with a minimum number of gates and enabling reductions in power consumption.

The FFs take in data at the rising edge or the falling edge of the clock signal, based on the number of gates from the clock source to the input clock buffers of the FFs, enabling a clock path with a minimum number of gates to be formed and facilitating reductions in power consumption.

The design supporting method described in the embodiments may be implemented by executing a prepared program on a computer such as a personal computer and a workstation. The design supporting program is stored on a computer-readable medium such as a hard disk, a flexible disk, a CD-ROM, an MO, and a DVD and is read from the recording medium by the computer for execution. The design supporting program may be distributed through a network such as the Internet. However, the computer-readable medium does not include a transitory medium such as a propagation signal.

According to the embodiments, the number of gates on a clock path can be easily optimized using single-gate clock buffers, thereby reducing power consumption.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A design supporting method of designing a semiconductor integrated circuit that includes a plurality of data holding elements and a clock path that propagates a clock signal from a clock source to the data holding elements, wherein a computer executes:
   detecting, from layout data of the semiconductor integrated circuit, a clock path that propagates the clock signal and of which clock buffers are single-gate inverting clock buffers;
   selecting sequentially the data holding elements connected to the clock path detected at the detecting;
   identifying an input clock buffer of the data holding element, each time a data holding element is selected at the selecting;
   determining whether the clock buffer identified at the identifying outputs the clock signal from the clock source according to non-inverting logic or inverting logic, based on a number of gates from the clock source to the clock buffer;
   replacing, based on a result obtained at the determining, the data holding element with a first data holding element that takes in data in synchronization with a rising edge of the clock signal or with a second data holding element that takes in data in synchronization with a falling edge of the clock signal; and
   outputting a result obtained at the replacing.

2. The design supporting method according to claim 1, wherein
   the determining includes determining that if the number of gates is an even number, the clock buffer identified at the identifying outputs the clock signal according to non-inverting logic and that if the number of gates is an odd number, the clock buffer outputs the clock signal according to inverting logic, and
   the replacing includes replacing the data holding element with the first data holding element if the clock buffer is determined to output the clock signal according to non-inverting logic, and with the second data holding element if the clock buffer is determined to output the clock signal according to inverting logic.

3. The design supporting method according to claim 2, wherein the computer further executes
   generating layout data by constructing a clock tree for a specified clock path, using only single-gate inverting clock buffers, wherein
   the detecting includes detecting, from the layout data generated at the generating, the clock path that propagates the clock signal from the clock source and of which clock buffers are single-gate inverting clock buffers.

4. The design supporting method according to claim 3, wherein the generating includes generating layout data by adjusting skew of a specified clock path, using only single-gate inverting clock buffers, wherein the detecting includes detecting, from the layout data generated at the generating, the clock path that propagates the clock signal from the clock source and of which clock buffers are single-gate inverting clock buffers.

5. The design supporting method according to claim 4, wherein the determining includes, if the clock signal from the clock source is propagated according to non-inverting logic at a point specified as a clock starting point, determining that the clock buffer outputs the clock signal according to non-inverting logic if the number of gates from the clock starting point to the clock buffer is an even number, and determining that the clock buffer outputs the clock signal according to inverting logic if the number of gates is an odd number, and the replacing includes replacing the data holding element with the first data holding element if at the determining, the clock buffer is determined to output the clock signal according to non-inverting logic, and with the second data holding element if at the determining, the clock buffer is determined to output the clock signal according to inverting logic.

6. The design supporting method according to claim 5, wherein the determining includes, if the clock signal from the clock source is output according to inverting logic, at a point specified as a clock starting point, determining that the clock buffer outputs the clock signal according to inverting logic if the number of gates from the clock starting point to the clock buffer is an even number, and determining that the clock buffer outputs the clock signal according to non-inverting logic if the number of gates is an odd number, and the replacing includes replacing the data holding element with the first data holding element if at the determining, the clock buffer is determined to output the clock signal according to non-inverting logic, and with the second data holding element if at the determining, the clock buffer is determined to output the clock signal according to inverting logic.

7. A design supporting device comprising:

a detecting unit that detects, from layout data, a clock path that propagates a clock signal from a clock source and of which clock buffers are single-gate inverting clock buffers;

a selecting unit that sequentially selects the data holding elements connected to the clock path detected by the detecting unit;

an identifying unit that identifies an input clock buffer of the data holding element, each time a data holding element is selected by the selecting unit;

a determining unit that based on a number of gates from the clock source to the clock buffer, determines whether the clock buffer identified by the identifying unit outputs the clock signal from the clock source according to non-inverting logic or inverting logic;

a replacing unit that based on a determination result obtained by the determining unit, replaces the data holding element with a first data holding element that takes in data in synchronization with a rising edge of the clock signal or with a second data holding element that takes in data in synchronization with a falling edge of the clock signal; and an output unit that outputs a replacement result obtained by the replacing unit.

8. A non-transitory computer-readable medium storing therein a design supporting program for designing a semiconductor integrated circuit that includes a plurality of data holding elements and a clock path that propagates a clock signal from a clock source to the data holding elements, the design supporting program causing a computer to execute a process comprising:

detecting, from layout data of the semiconductor integrated circuit, a clock path that propagates the clock signal and of which clock buffers are single-gate inverting clock buffers;

selecting sequentially the data holding elements connected to the clock path detected at the detecting;

identifying an input clock buffer of the data holding element, each time a data holding element is selected at the selecting;

determining, based on a number of gates from the clock source to the clock buffer, whether the clock buffer identified at the identifying outputs the clock signal from the clock source according to non-inverting logic or inverting logic;

replacing, based on a result of the determining, the data holding element with a first data holding element that takes in data in synchronization with a rising edge of the clock signal or with a second data holding element that takes in data in synchronization with a falling edge of the clock signal; and outputting a result obtained at the replacing.

* * * * *

UNITED STATES PATENT AND TRADEMARK OFFICE
CERTIFICATE OF CORRECTION

PATENT NO. : 8,365,121 B2
APPLICATION NO. : 13/373397
DATED : January 29, 2013
INVENTOR(S) : Kenji Suzuki It is certified that error appears in the above-identified patent and that said Letters Patent is hereby corrected as shown below:

Title Page, item (54) and in the specification, Column 1, Line 1, Title: Delete "SUPPORTING" and insert -- DESIGN SUPPORTING --, therefor.

Signed and Sealed this
Thirtieth Day of April, 2013

Teresa Stanek Rea
*Acting Director of the United States Patent and Trademark Office*